(12) United States Patent
Nagata

(10) Patent No.: US 6,590,195 B2
(45) Date of Patent: Jul. 8, 2003

(54) SOLID-STATE IMAGE SENSOR WITH REDUCED SMEAR AND NOISE

(75) Inventor: Tsuyoshi Nagata, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 179 days.

(21) Appl. No.: 09/842,141

(22) Filed: Apr. 26, 2001

(65) Prior Publication Data

US 2001/0040210 A1 Nov. 15, 2001

(30) Foreign Application Priority Data

May 15, 2000 (JP) .................................. 2000-142091

(51) Int. Cl.[7] .............................................. H01L 5/335
(52) U.S. Cl. .................................... 250/208.1; 257/428
(58) Field of Search ...................... 250/208.1, 208.2; 257/292, 428

(56) References Cited

U.S. PATENT DOCUMENTS 4,498,013 A * 2/1985 Kuroda et al. ............ 250/208.1

FOREIGN PATENT DOCUMENTS

JP        60084076 A    * 5/1985       .......... H04N/5/335

* cited by examiner

Primary Examiner—Georgia Epps
Assistant Examiner—Richard Hanig
(74) Attorney, Agent, or Firm—Young & Thompson

(57) ABSTRACT

A solid-state image sensor includes a semiconductor bulk region of a first conductivity type; at least a drain region of a second conductivity type selectively provided in the semiconductor bulk region; at least a photoelectric converter region of the second conductivity type selectively provided in the semiconductor bulk region, and the photoelectric converter region being separated from the drain region; and at least a potential barrier region of the first conductivity type selectively provided in the semiconductor bulk region, the potential barrier region being adjacent to at least a part of bottom and side faces of the photoelectric converter region, and the potential barrier region having a higher impurity concentration than the semiconductor bulk region.

9 Claims, 21 Drawing Sheets

SOLID-STATE IMAGE SENSOR WITH REDUCED SMEAR AND NOISE

BACKGROUND OF THE INVENTION

1. Field of the Invention

The present invention relates to a solid-state image sensor, and more particularly to a solid-state image sensor with reduced smear and noise.

2. Description of the Related Art

The solid-state image sensor has a silicon substrate of a first conductivity type. The substrate has a photoelectric converter region of a second conductivity type and a drain region of the second conductivity type. The photoelectric converter region and the drain region are separated by a channel region, which underlies a transfer gate. If charges are injected from the substrate into the drain region, then smear and/or noise may appear on an image sensed by the sensor. In order to have suppressed smear and noise, it was proposed that the photoelectric convener region is deeper in junction depth than the drain region.

Japanese laid-open patent publication No. 61-99472 discloses such a proposal as described above. FIG. 1 is a schematic cross sectional elevation view of a conventional solid-state image sensor The solid-state image sensor has a p-type silicon substrate 105. An n-type photo-diode region 101 is selectively provided in an upper region of the p-type silicon substrate 105. A drain region 104 is also selectively provided in another upper region of the p-type silicon substrate 105, wherein the drain region 104 is separated from the n-type photo-diode region 101 by a channel region. A transfer gate electrode 103 is provided which overlies the channel region between the drain region 104 and the n-type photo-diode region 101. A p-type low impurity concentration region 102 is selectively provided, which underlies the n-type photo-diode region 101, so that an entire bottom face of the n-type photo-diode region 101 is bounded by the p-type low impurity concentration region 102 from the p-type silicon substrate 105.

Smear charges, which may cause smear, may be generated in the p-type silicon substrate 105. The generated smear charges are drawn into the p-type low impurity concentration region 102, and the smear charges are then captured into the n-type photo-diode region 101, whereby it is prevented that the smear charges are drawn into the drain region 104, resulting in that smear is suppressed. The smear charges generated in the silicon substrate 105 as balk region include electrons and holes, for example, injected electrons and holes into the silicon substrate as well as electrons and holes generated from pixels of the solid-state image sensor.

The above conventional structure prevents that smear charges generated in the silicon substrate 105 are drawn to the drain region 104, but does not prevent that smear charges generated in the silicon substrate 105 are drawn to the n-type photo-diode region 101.

In the above circumstances, it had been required to develop a novel solid-state image sensor free from the above problem.

SUMMARY OF THE INVENTION

Accordingly, it is an object of the present invention to provide a novel solid-state image sensor free from the above problems.

It is a further object of the present invention to provide a novel solid-state image sensor, which shows smear-reduced images.

It is a still further object of the present invention to provide a novel solid-state image sensor, which shows noise-reduced images.

It is yet a further object of the present invention to provide a novel solid-state image sensor, which prevents smear charges generated in a silicon substrate from being drawn to not only a drain region but also a photoelectric converter region.

The present invention provides a solid-state image sensor comprising: a semiconductor bulk region of a first conductivity type; at least a drain region of a second conductivity type selectively provided in the semiconductor bulk region; at least a photoelectric converter region of the second conductivity type selectively provided in the semiconductor bulk region, and the photoelectric converter region being separated from the drain region; and at least a potential barrier region of the first conductivity type selectively provided in the semiconductor bulk region, the potential barrier region being adjacent to at least a part of bottom and side faces of the photoelectric converter region, and the potential barrier region having a higher impurity concentration than the semiconductor bulk region.

The potential barrier region prevents charges generated in the semiconductor bulk region from being drawn into the photoelectric converter region. The potential barrier region also prevents leakage of charges from the photoelectric converter region to the semiconductor bulk region. The potential barrier region reduces smear and noise of images.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION

Figure 1:
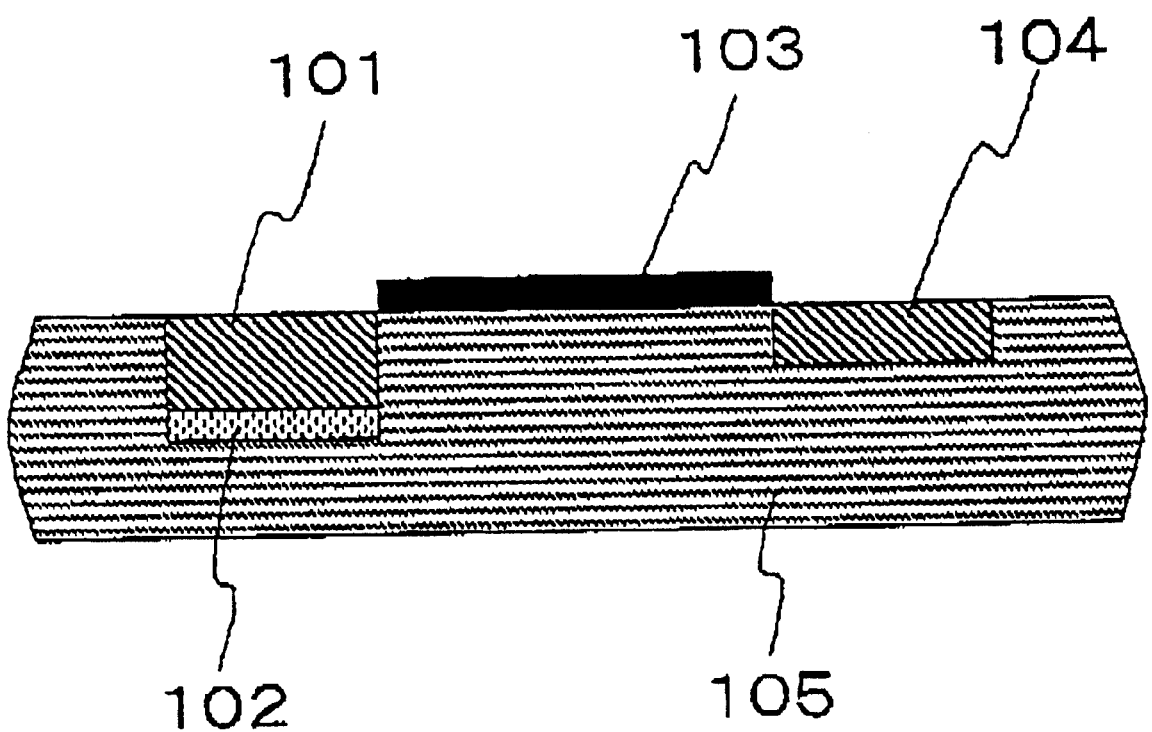
FIG. 1 is a schematic cross sectional elevation view of a conventional solid-state image sensor.

A first aspect of the present invention is a solid-state image sensor comprising: a semiconductor bulk region of a first conductivity type; at least a drain region of a second conductivity type selectively provided in the semiconductor bulk region; at least a photoelectric converter region of the second conductivity type selectively provided in the semiconductor bulk region, and the photoelectric converter region being separated from the drain region; and at least a potential barrier region of the first conductivity type selectively provided in the semiconductor bulk region, the potential barrier region being adjacent to at least a part of bottom and side faces of the photoelectric converter region, and the potential barrier region having a higher impurity concentration than the semiconductor bulk region.

The potential barrier region prevents charges generated in the semiconductor bulk region from being drawn into the photoelectric converter region. The potential barrier region also prevents leakage of charges from the photoelectric converter region to the semiconductor bulk region. The potential barrier region reduces smear and noise of images.

It is preferable that the potential barrier region is in contact directly with an entire region of the bottom face of the photoelectric converter region.

It is further preferable that the potential barrier region has peripheral edges which are substantially aligned to peripheral edges of the photoelectric converter region.

It is also preferable that the potential barrier region has a laterally extending portion which extends from an inside edge of the photoelectric converter region toward the drain region, so that an inside edge of the potential barrier region is positioned closer to the drain region than the inside edge of the photoelectric converter region in a lateral direction.

It is also preferable that the potential barrier region has a vertically extending portion which extends along the side faces of the photoelectric converter region.

It is also preferable that the potential barrier region is distanced by a part of the bulk region from an entire region of the bottom face of the photoelectric converter region.

It is further preferable that the potential barrier region has peripheral edges which are substantially aligned to peripheral edges of the photoelectric converter region.

It is also preferable that the potential barrier region has an inside-extending portion which extends from an inside edge of the photoelectric converter region toward the drain region, so that an inside edge of the potential barrier region is positioned closer to the drain region than the inside edge of the photoelectric converter region.

It is also preferable that the potential barrier region has a laterally extending portion which extends from an inside edge of the photoelectric converter region toward the drain region, so that an inside edge of the potential barrier region is positioned closer to the drain region than the inside edge of the photoelectric converter region in a lateral direction.

It is also preferable that the potential barrier region has a vertically extending portion which extends along the side faces of the photoelectric converter region.

It is also preferable to further comprise: an interposed region of the first conductivity type, which overlies the potential barrier region and underlies a bottom face of the photoelectric converter region, and the interposed region having a different impurity concentration from the semiconductor bulk region and the potential barrier region, so that the potential barrier region is separated by the interposed region from the bottom face of the photoelectric converter region.

It is also preferable that the potential barrier region has peripheral edges which are substantially aligned to peripheral edges of the photoelectric converter region.

It is also preferable that the potential barrier region has an inside-extending portion which extends from an inside edge of the photoelectric converter region toward the drain region, so that an inside edge of the potential barrier region is positioned closer to the drain region than the inside edge of the photoelectric converter region.

It is also preferable that the potential barrier region has a vertically extending portion which extends along the side faces of the photoelectric converter region.

It is also preferable that the potential barrier region has a bottom level which is deeper than a bottom level of the drain region.

It is also preferable that the semiconductor bulk region comprises a semiconductor substrate.

It is also preferable to further comprise an isolation region selectively provided in the semiconductor bulk region, and the isolation region bring in contact with an upper region of the side faces of the photo-converter region, except an inside side face which faces toward the drain region.

PREFERRED EMBODIMENTS

First Embodiment

Figure 2:
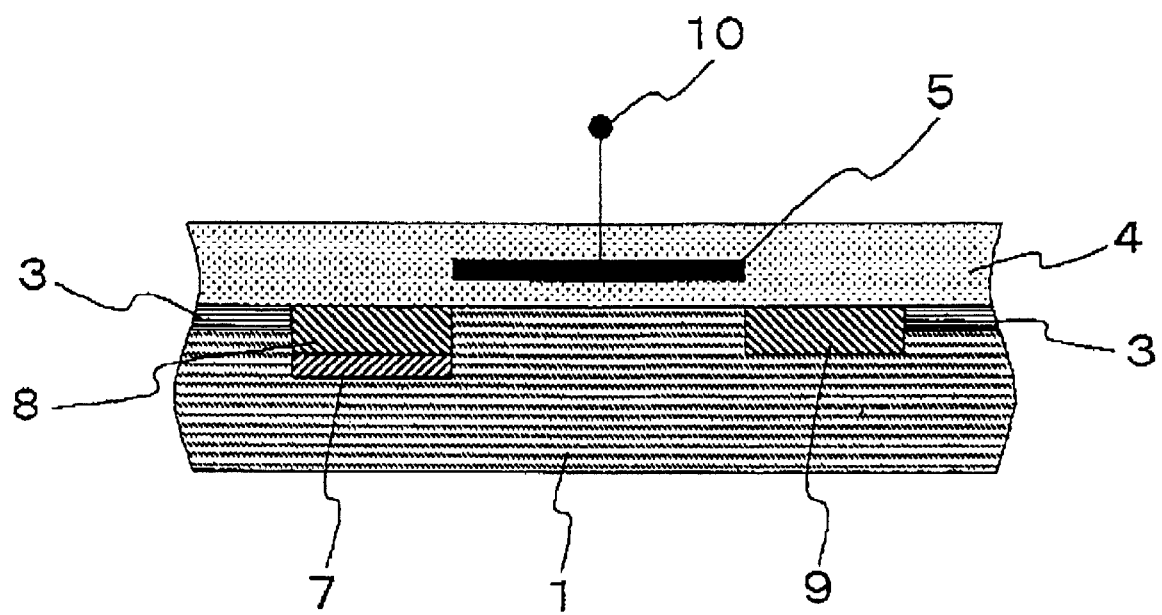
FIG. 2 is a fragmentary cross sectional elevation view of a solid-state image sensor in a first embodiment in accordance with the present invention.

A first embodiment according to the present invention will be described in detail with reference to the drawings. FIG. 2 is a fragmentary cross sectional elevation view of a solid-state image sensor in a first embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8, so that an entire bottom face of the n-type photoelectric converter region 8 is in contact directly with the p-type high impurity concentration region 7. The entire bottom face of the n-type photoelectric converter region 8 is thus separated by the p-type high impurity concentration region 7 from the p-type silicon substrate 1. An entire top face of the n-type photoelectric converter region 8 is in contact directly with the insulating layer 4. Side faces of the n-type photoelectric converter region 8 are surrounded partially by the isolation region 3 and mostly by the p-type silicon substrate 1. Namely, the p-type high impurity concentration region 7 underlies the entire bottom face of the n-type photoelectric converter region 8 but does not extend to the side faces of the n-type photoelectric converter region 8. Peripheral edges of the p-type high impurity concentration region 7 are aligned to peripheral edges of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face of the region 8. The p-type high impurity concentration region 7 as the potential barrier also prevents leakage of charges from the n-type photoelectric converter region 8 to the p-type silicon substrate through the bottom face of the region 8. The p-type high impurity concentration region 7 as the potential barrier reduces smear and noise of images.

A method of forming the above solid-state image sensor will subsequently be described. FIGS. 3A through 3F are fragmentary cross sectional elevation views of solid-state image sensors in a first embodiment in accordance with the present invention.

Figure 3A:
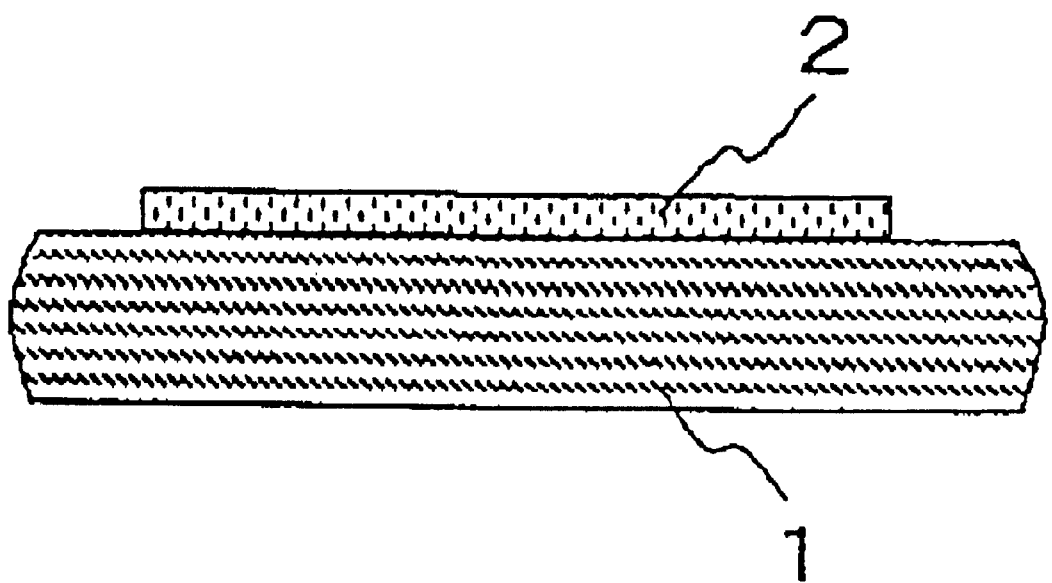
FIGS. 3A through 3F are fragmentary cross sectional elevation views of solid-state image sensors in a first embodiment in accordance with the present invention.

With reference to FIG. 3A, a silicon nitride film 2 is entirely deposited over a p-type silicon substrate 1 by a chemical vapor deposition method. A photo-resist pattern is formed over the silicon nitride film 2 by a photo-lithography technique. The silicon nitride film 2 is selectively etched by an anisotropic etching method using the photo-resist pattern as a mask, so that the silicon nitride film 2 remains over a device region. The photo-resist pattern is then removed.

Figure 3B:
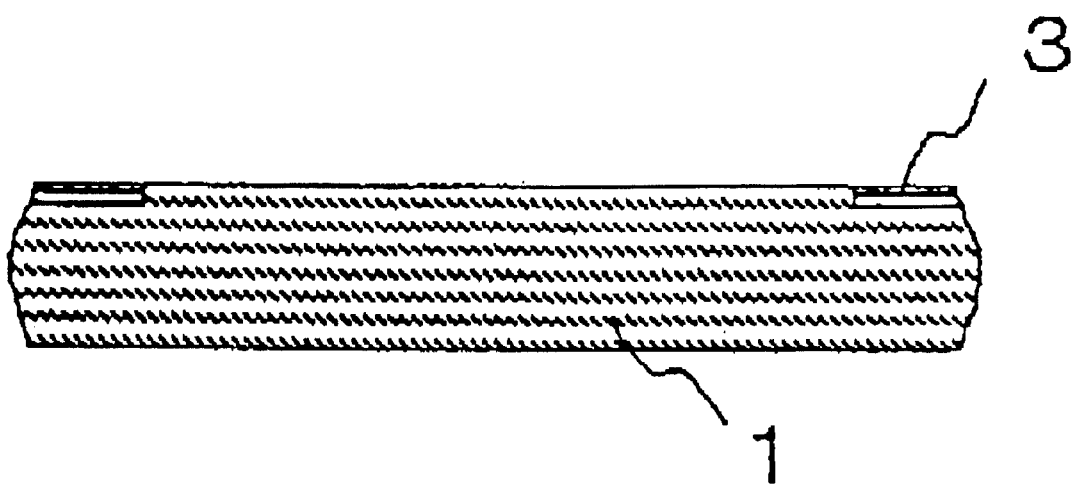

With reference to FIG. 3B, isolation layers 3 are selectively formed in upper regions of the p-type silicon substrate 1 by a selective oxidation method or a selective ion-implantation using the silicon nitride film 2 as a mask. The used silicon nitride film 2 is then removed.

Figure 3C:
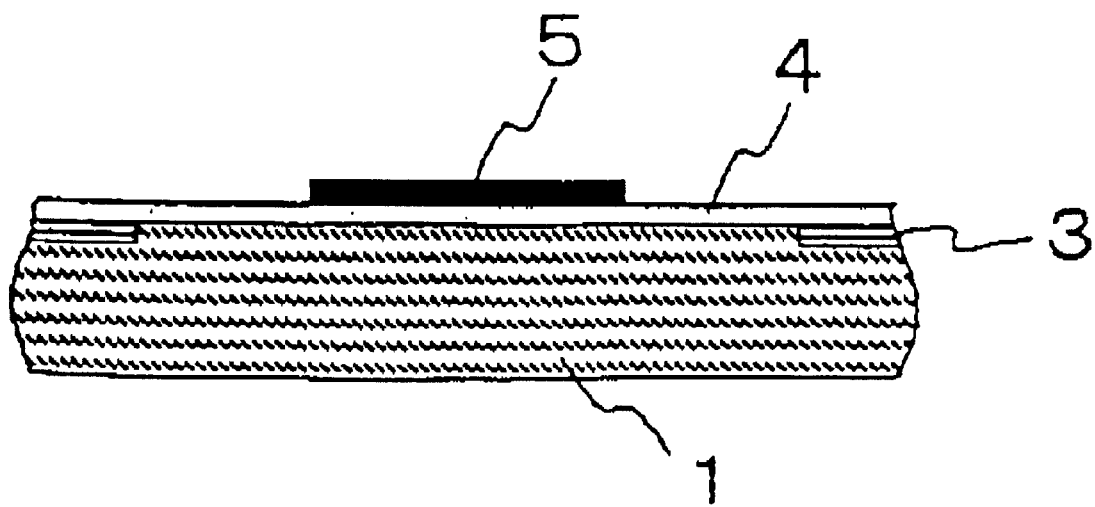

With reference to FIG. 3C, an insulating layer 4 is formed over a top surface of the substrate 1 by a silicon oxidation method or a chemical vapor deposition. An electrode layer 5 is then entirely formed over the insulating layer 4, wherein the electrode layer 5 may comprise either an impurity doped polysilicon film or a metal silicide layer. The electrode layer 5 is patterned by a lithography technique to selectively form a transfer gate electrode 5 over the insulating layer 4.

Figure 3D:
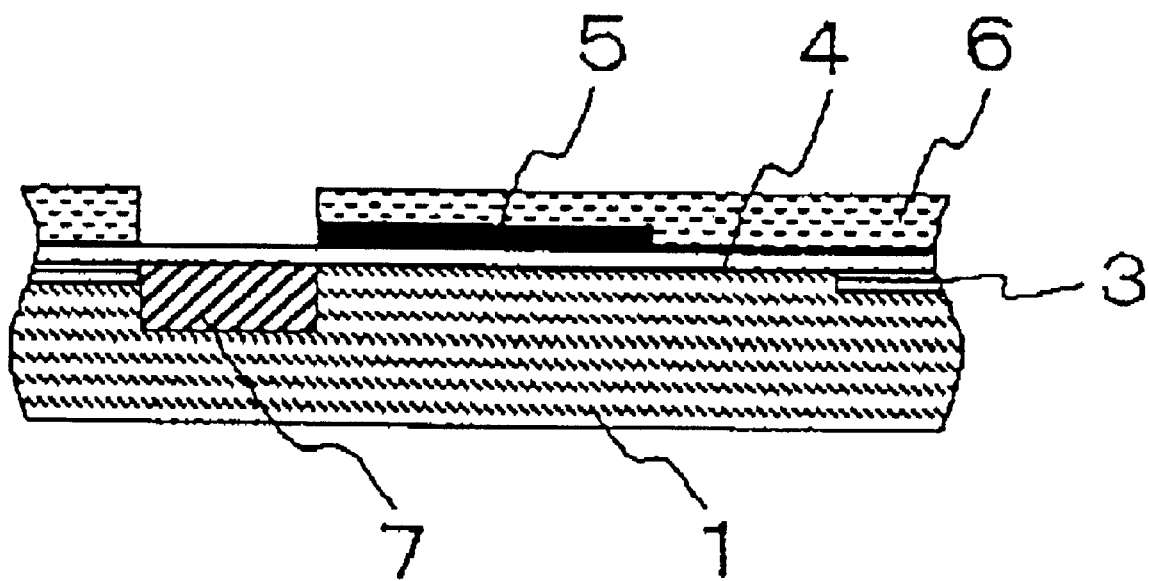

With reference to FIG. 3D, a photo-resist pattern 6 is selectively formed over the insulating layer 4 and the transfer gate electrode 5. An ion-implantation of p-type impurity is carried out by use of the photo-resist pattern 6 for selectively introducing the p-type impurity into a selected region of the p-type silicon substrate 1, whereby a p-type high impurity concentration region 7 is selectively formed in the p-type silicon substrate 1.

Figure 3E:
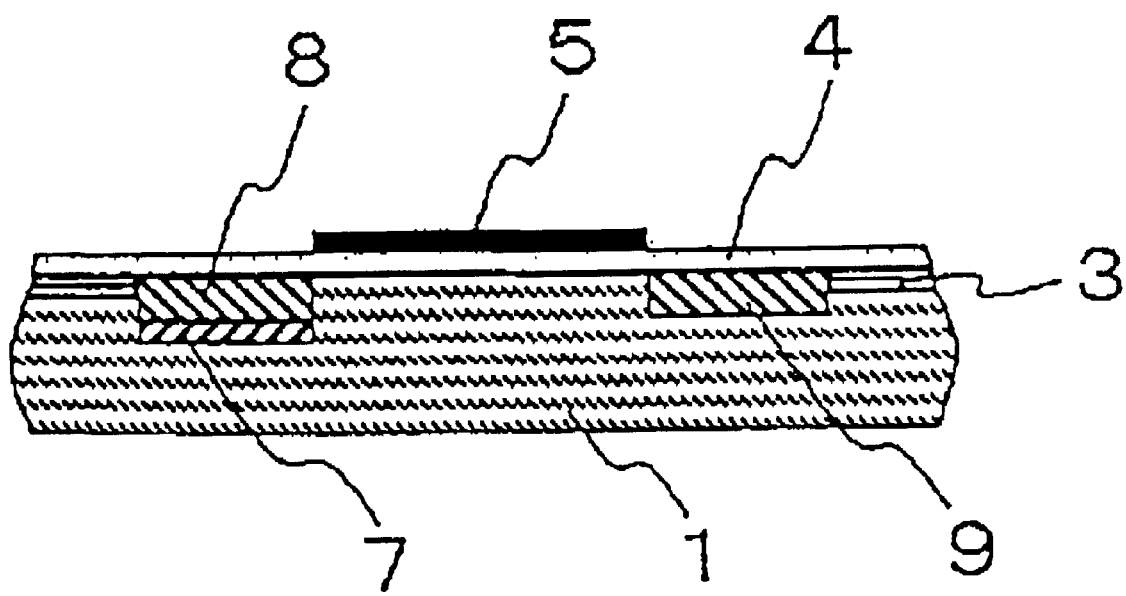

With reference to FIG. 3E, the photo-resist pattern 6 is further selectively etched. Another ion-implantation of n-type impurity is carried out by use of the photo-resist pattern 6 for selectively introducing the n-type impurity into the p-type high impurity concentration region 7 and another selected region of the p-type silicon substrate 1, whereby an n-type photoelectric converter region 8 and an n-type drain region are selectively formed in the p-type silicon substrate 1. The used photo-resist pattern 6 is removed.

Figure 3F:
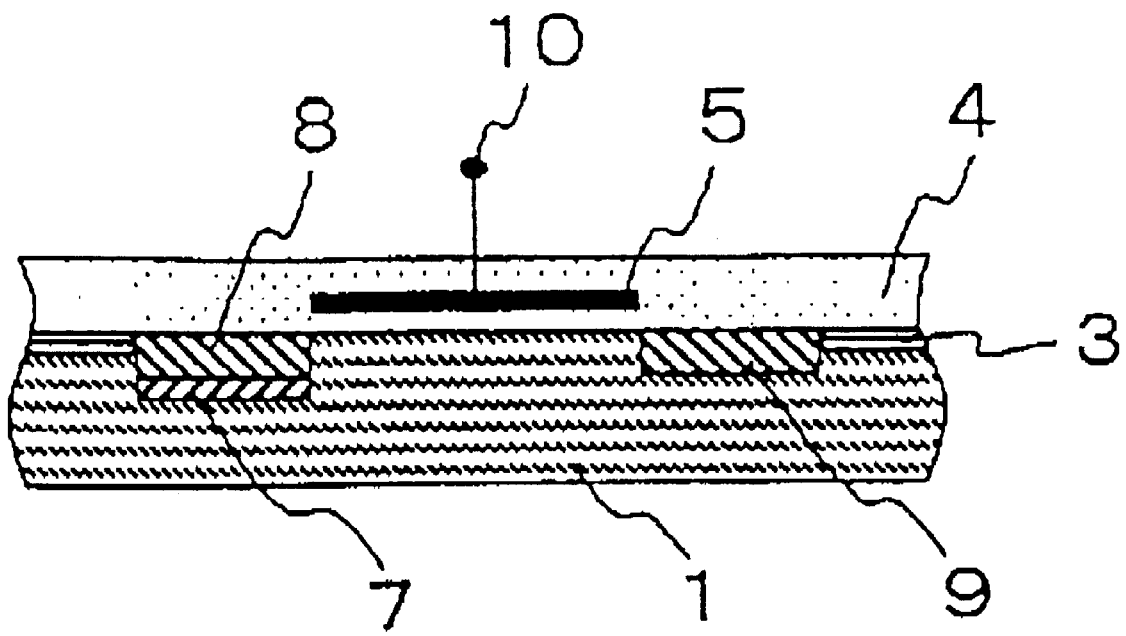

With reference to FIG. 3F, a silicon oxide film 4 is formed by a chemical vapor deposition method. A contact hole is formed in the silicon oxide film 4 and a connecting line 10 is formed in the contact hole 10.

Second Embodiment

Figure 4:
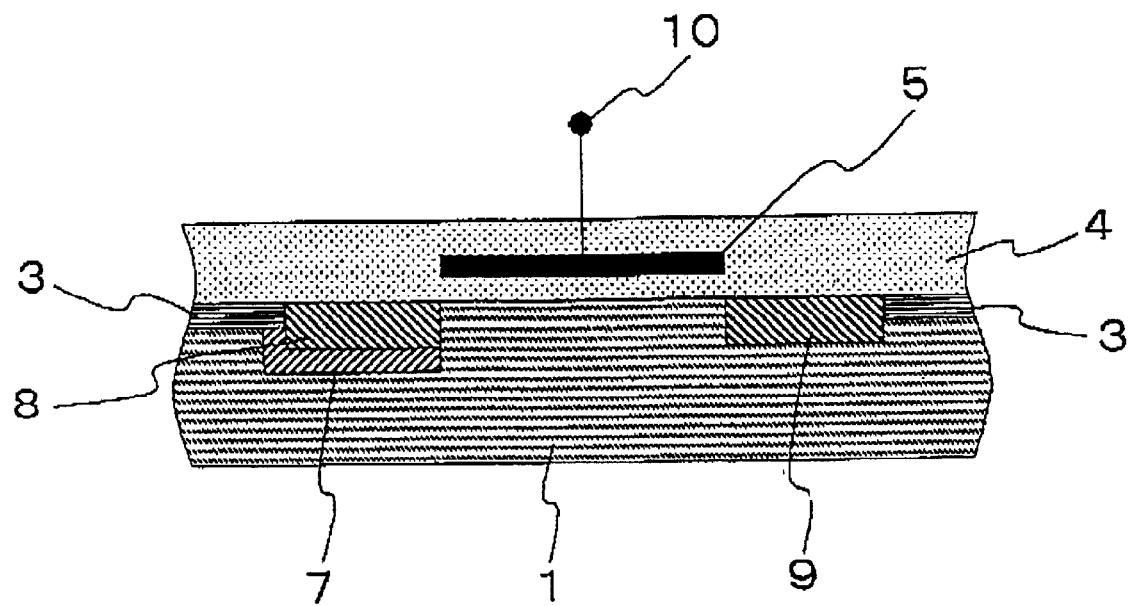
FIG. 4 is a fragmentary cross sectional elevation view of a solid-state image sensor in a second embodiment in accordance with the present invention.

A second embodiment according to the present invention will be described in detail with reference to the drawings. FIG. 4 is a fragmentary cross sectional elevation view of a solid-state image sensor in a second embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4 so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 to the bottom of the isolation layer 3, so that the p-type high impurity concentration region 7 is in contact with both the entire bottom face and the side faces except for an inside side face which faces toward the n-type drain region 9. Both the entire bottom face and the side faces except for the inside side face of the n-type photoelectric converter region 8 are in contact directly with the p-type high impurity concentration region 7. The entire bottom face and the side faces except for the inside side face of the n-type photoelectric converter region 8 are thus separated by the p-type high impurity concentration region 7 from the p-type silicon substrate 1. An entire top face of the n-type photoelectric converter region 8 is in contact directly with the insulating layer 4. The inside side face of the n-type photoelectric converter region 8 is in contact with the p-type silicon substrate 1. Namely, the p-type high impurity concentration region 7 underlies the entire bottom face of the n-type photoelectric converter region 8 and further extends along the entire side faces except for the inside side face of the n-type photoelectric converter region 8. An inside edge of the p-type high impurity concentration region 7 is aligned to the inside edge of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces except for the inside side face of the region 8. The p-type high impurity concentration region 7 as the potential barrier also prevents leakage of charges from the n-type photoelectric converter region 8 to the p-type silicon substrate through the bottom face and the side faces except for the inside side face of the region 8. The p-type high impurity concentration region 7 as the potential barrier reduces smear and noise of images. The solid-state image sensor of this embodiment shows a higher effect of reducing the smear and noise of images than that of the first embodiment.

Third Embodiment

Figure 5:
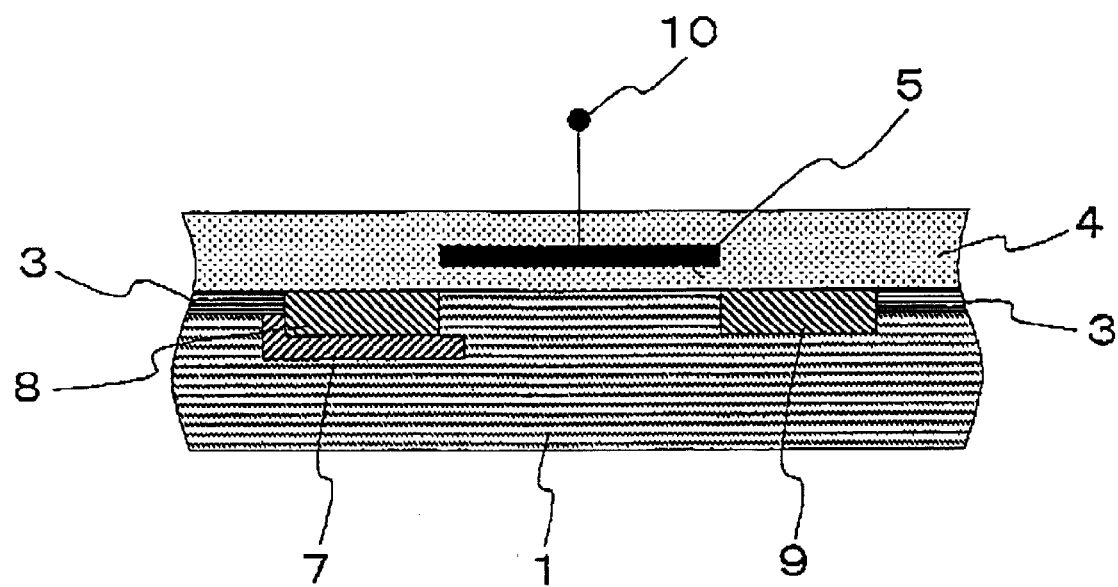
FIG. 5 is a fragmentary cross sectional elevation view of a solid-state image sensor in a third embodiment in accordance with the present invention.

A third embodiment according to the present invention will be described in detail with reference to the drawings. FIG. 5 is a fragmentary cross sectional elevation view of a solid-state image sensor in a third embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 to the bottom of the isolation layer 3 and further extends from the bottom inside edge of the n-type photoelectric converter region 8 in the inside direction toward the drain region 9, so that the p-type high impurity concentration region 7 is in contact with both the entire bottom face and the side faces except for an inside side face which faces toward the n-type drain region 9. Both the entire bottom face and the side faces except for the inside side face of the n-type photoelectric converter region 8 are in contact directly with the p-type high impurity concentration region 7. The entire bottom face and the side faces except for the inside side face of the n-type photoelectric converter region 8 are thus separated by the p-type high impurity concentration region 7 from the p-type silicon substrate 1. An entire top face of the n-type photoelectric converter region 8 is in contact directly with the insulating layer 4. The inside side face of the n-type photoelectric converter region 8 is in contact with the p-type silicon substrate 1. Namely, the p-type high impurity concentration region 7 underlies the entire bottom face of the n-type photoelectric converter region 8 and further extends along the entire side faces except for the inside side face of the n-type photoelectric converter region 8. An inside edge of the p-type high impurity concentration region 7 is positioned more inside of the inside edge of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces except for the inside side face of the region 8. The p-type high impurity concentration region 7 as the potential barrier also prevents leakage of charges from the n-type photoelectric converter region 8 to the p-type silicon substrate through the bottom face and the side faces except for the inside side face of the region 8. The p-type high impurity concentration region 7 as the potential barrier reduces smear and noise of images. The extending portion of the p-type high impurity concentration region 7 from the bottom inside edge of the n-type photoelectric converter region 8 in the inside direction toward the drain region 9 increases the effect of reducing smear and noise on image. The solid-state image sensor of this embodiment shows a higher effect of reducing the smear and noise of images than that of the second embodiment.

Fourth Embodiment

Figure 6:
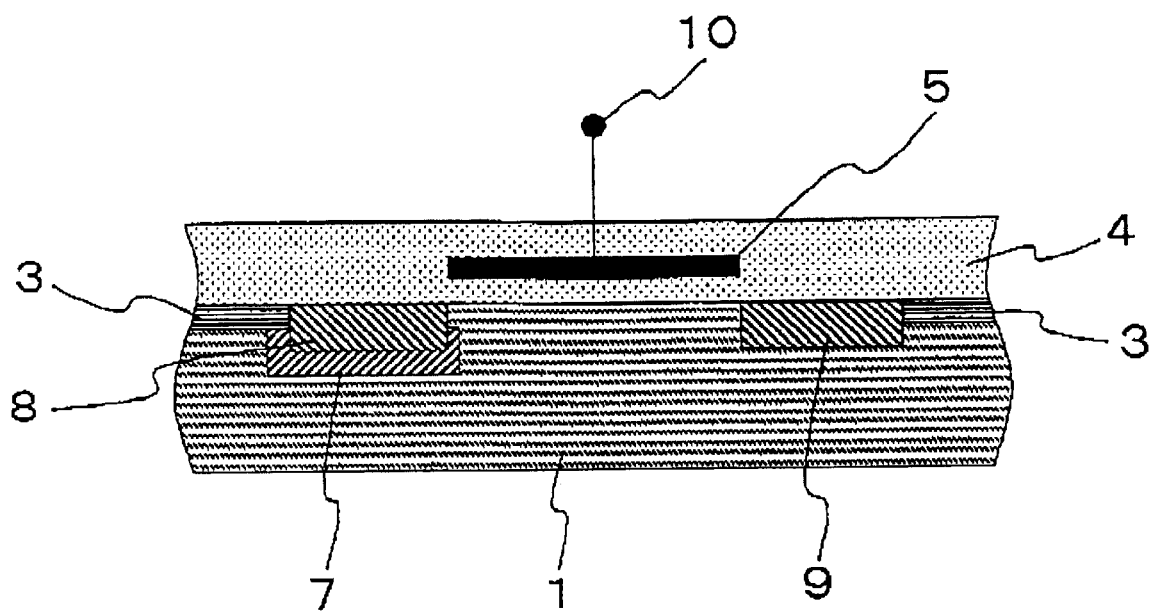
FIG. 6 is a fragmentary cross sectional elevation view of a solid-state image sensor in a fourth embodiment in accordance with the present invention.

A fourth embodiment according to the present invention will be described in detail with reference to the drawings. FIG. 6 is a fragmentary cross sectional elevation view of a solid-state image sensor in a fourth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 up to the same level as the bottom of the isolation layer 3, so that the p-type high impurity concentration region 7 extends in contact directly with both the entire bottom face and the side faces of the region 8 up to the same level as the bottom of the isolation layer 3. Both the entire bottom face and the side faces of the n-type photoelectric converter region 8, except above the bottom level of the isolation layer 3, are in contact directly with the p-type high impurity concentration region 7. The entire bottom face and the side faces of the n-type photoelectric converter region 8, except above the bottom level of the isolation layer 3, are thus separated by the p-type high impurity concentration region 7 from the p-type silicon substrate 1. An entire top face of the n-type photoelectric converter region 8 is in contact directly with the insulating layer 4. Namely, the p-type high impurity concentration region 7 underlies the entire bottom face of the n-type photoelectric converter region 8 and further extends along the side faces of the n-type photoelectric converter region 8, except above the bottom level of the isolation layer 3.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces of the region 8, except above the bottom level of the isolation layer 3. The p-type high impurity concentration region 7 as the potential barrier also prevents leakage of charges from the n-type photoelectric converter region 8 to the p-type silicon substrate through the bottom face and the side faces of the region 8, except above the bottom level of the isolation layer 3, The p-type high impurity concentration region 7 as the potential barrier reduces smear and noise of images. The solid-state image sensor of this embodiment shows a higher effect of reducing the smear and noise of images than that of the third embodiment.

Fifth Embodiment

Figure 7:
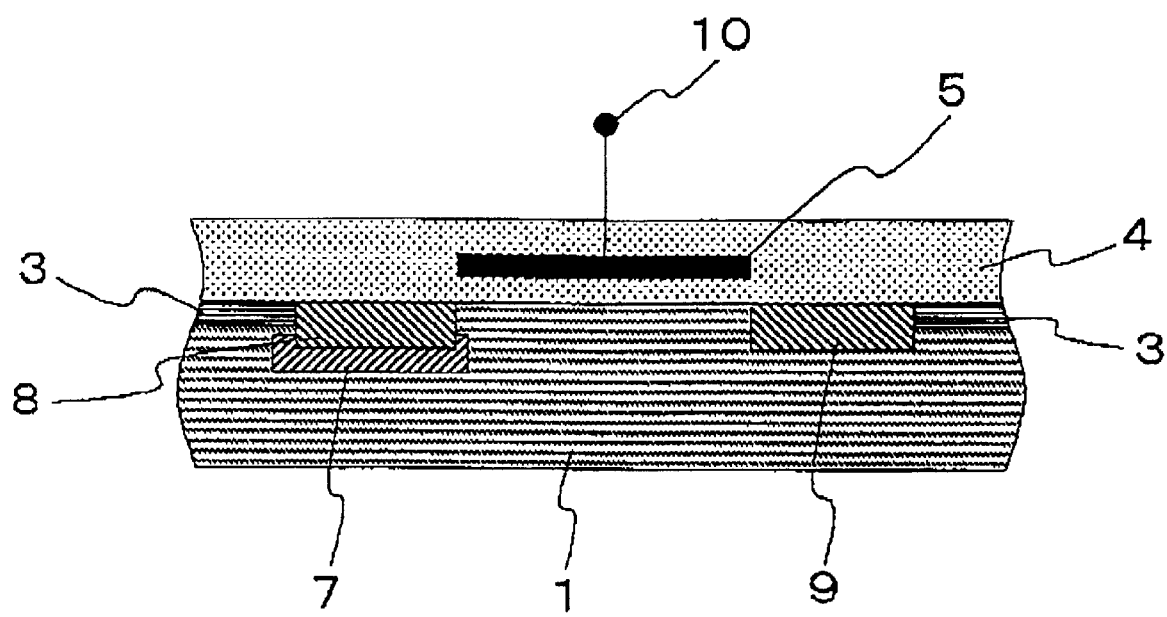
FIG. 7 is a fragmentary cross sectional elevation view of a solid-state image sensor in a fifth embodiment in accordance with the present invention.

A fifth embodiment according to the present invention will be described in detail with reference to the drawings. FIG. 7 is a fragmentary cross sectional elevation view of a solid-state image sensor in a fifth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 up to a lower level than the bottom of the isolation layer 3, so that the p-type high impurity concentration region 7 extends in contact directly with both the entire bottom face and the side faces of the region 8 up to the lower level than the bottom of the isolation layer 3. Both the entire bottom face and the side faces of the n-type photoelectric converter region 8, except above the lower level than the bottom level of the isolation layer 3, are in contact directly with the p-type high impurity concentration region 7. The entire bottom face and the side faces of the n-type photoelectric converter region 8, except above the lower level than the bottom level of the isolation layer 3, are thus separated by the p-type high impurity concentration region 7 from the p-type silicon substrate 1. An entire top face of the n-type photoelectric converter region 8 is in contact directly with the insulating layer 4. Namely, the p-type high impurity concentration region 7 underlies the entire bottom face of the n-type photoelectric converter region 8 and further extends along the side faces of the n-type photoelectric converter region 8, except above the lower level than the bottom level of the isolation layer 3.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces of the region 8, except above the lower level than the bottom level of the isolation layer 3. The p-type high impurity concentration region 7 as the potential barrier also prevents leakage of charges from the n-type photoelectric converter region 8 to the p-type silicon substrate through the bottom face and the side faces of the region 8, except above the lower level than the bottom level of the isolation layer 3. The p-type high impurity concentration region 7 as the potential barrier reduces smear and noise of images. The solid-state image sensor of this embodiment shows a higher effect of reducing the smear and noise of images than that of the first embodiment.

Sixth Embodiment

Figure 8:
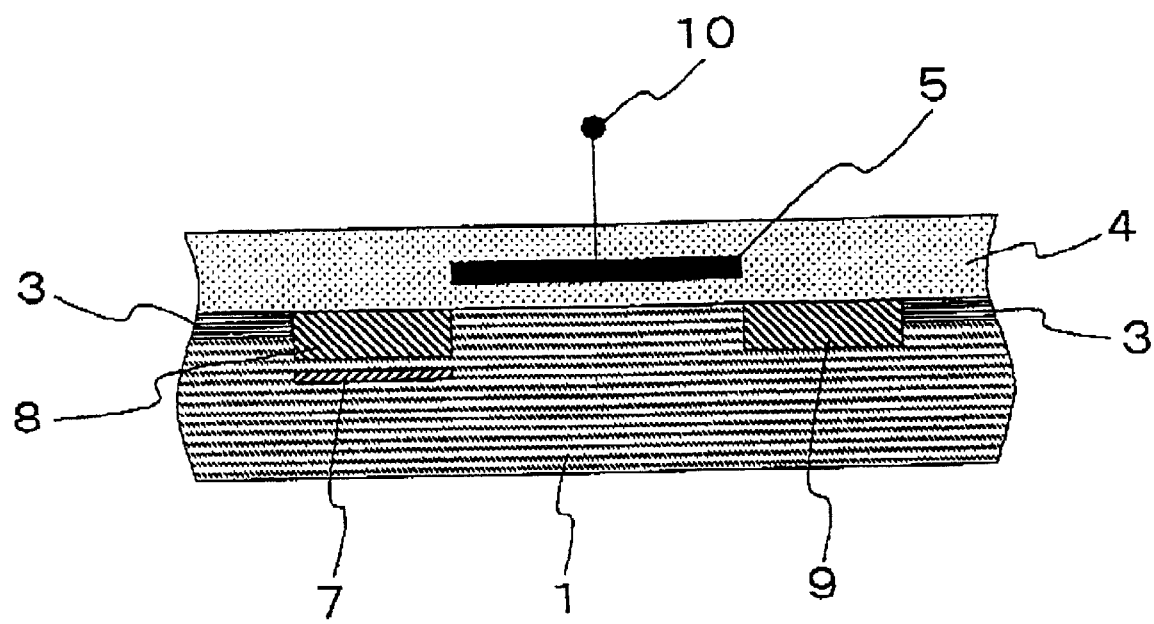
FIG. 8 is a fragmentary cross sectional elevation view of a solid-state image sensor in a sixth embodiment in accordance with the present invention.

A sixth embodiment according to the present invention will be described in detail with reference to the drawings. FIG. 8 is a fragmentary cross sectional elevation view of a solid-state image sensor in a sixth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8, so that an entire bottom face of the n-type photoelectric converter region 8 is adjacent to but not contact with the p-type high impurity concentration region 7. The entire bottom face of the n-type photoelectric converter region 8 is thus separated by the p-type high impurity concentration region 7 from the p-type silicon substrate 1. An entire top face of the n-type photoelectric convener region 8 is in contact directly with the insulating layer 4. Side faces of the n-type photoelectric converter region 8 are surrounded partially by the isolation region 3 and mostly by the p-type silicon substrate 1. Namely, the p-type high impurity concentration region 7 underlies the entire bottom face of the n-type photoelectric converter region 8 but does not extend to the side faces of the n-type photoelectric converter region 8. Peripheral edges of the p-type high impurity concentration region 7 are aligned to peripheral edges of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face of the region 8. The p-type high impurity concentration region 7 as the potential barrier also prevents leakage of charges from the n-type photoelectric converter region 8 to the p-type silicon substrate through the bottom face of the region 8. The p-type high impurity concentration region 7 as the potential barrier reduces smear and noise of images.

Seventh Embodiment

Figure 9:
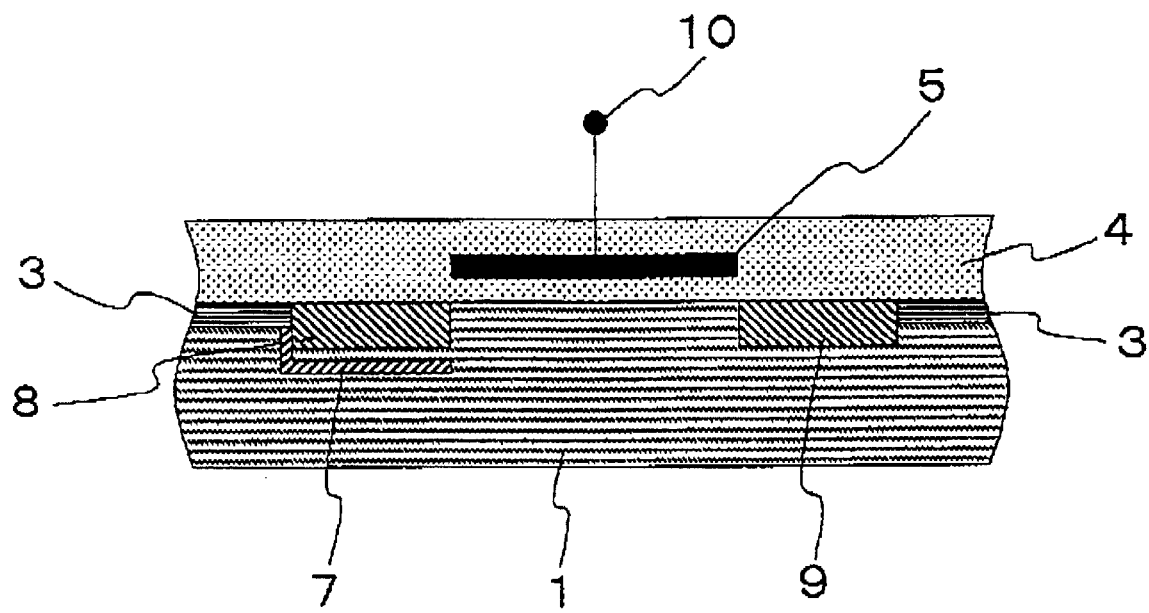
FIG. 9 is a fragmentary cross sectional elevation view of a solid-state image sensor in a seventh embodiment in accordance with the present invention.

A seventh embodiment according to the present invention will be described in detail with reference to the drawings. FIG. 9 is a fragmentary cross sectional elevation view of a solid-state image sensor in a seventh embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 to the bottom of the isolation layer 3, so that the p-type high impurity concentration region 7 is adjacent to but not contact with the entire bottom face and is in contact directly with the side faces except for an inside side face which faces toward the n-type drain region 9. Both the entire bottom face and the side faces except for the inside side face of the n-type photoelectric converter region 8 are surrounded by the p-type high impurity concentration region 7. The entire bottom face and the side faces except for the inside side face of the n-type photoelectric converter region 8 are thus separated by the p-type high impurity concentration region 7 from the p-type silicon substrate 1. An entire top face of the n-type photoelectric converter region 8 is in contact directly with the insulating layer 4. The inside side face of the n-type photoelectric converter region 8 is in contact with the p-type silicon substrate 1. Namely, the p-type high impurity concentration region 7 underlies the entire bottom face of the n-type photoelectric converter region 8 and further extends along the entire side faces except for the inside side face of the n-type photoelectric converter region 8. An inside edge of the p-type high impurity concentration region 7 is aligned to the inside edge of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces except for the inside side face of the region 8. The p-type high impurity concentration region 7 as the potential barrier also prevents leakage of charges from the n-type photoelectric converter region 8 to the p-type silicon substrate through the bottom face and the side faces except for the inside side face of the region 8. The p-type high impurity concentration region 7 as the potential barrier reduces smear and noise of images. The solid-state image sensor of this embodiment shows a higher effect of reducing the smear and noise of images than that of the sixth embodiment.

Eight Embodiment

Figure 10:
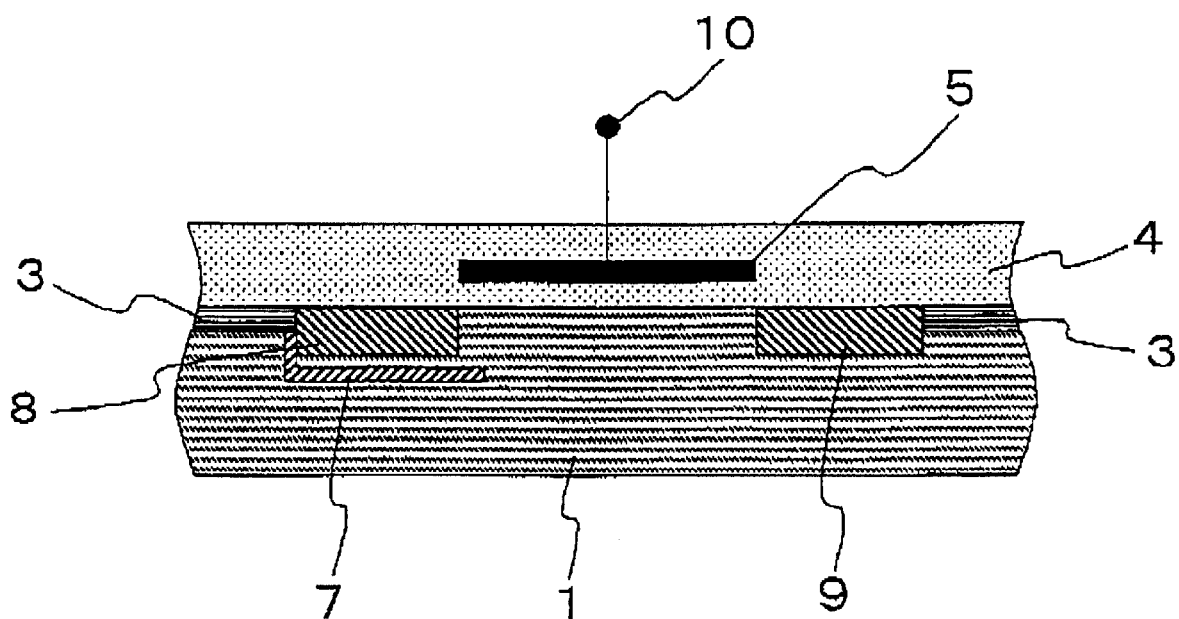
FIG. 10 is a fragmentary cross sectional elevation view of a solid-state image sensor in an eighth embodiment in accordance with the present invention.

An eighth embodiment according to the present invention will be described in detail with reference to the drawings. FIG. 10 is a fragmentary cross sectional elevation view of a solid-state image sensor in an eighth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 to the bottom of the isolation layer 3 and further extends from the bottom inside edge of the n-type photoelectric converter region 8 in the inside direction toward the drain region 9, so that the p-type high impurity concentration region 7 is adjacent to but not contact with the entire bottom face and is in contact directly with the side faces except for an inside side face which faces toward the n-type drain region 9. Both the entire bottom face and the side faces except for the inside side face of the n-type photoelectric converter region 8 are surrounded by the p-type high impurity concentration region 7. The entire bottom face and the side faces except for the inside side face of the n-type photoelectric converter region 8 are thus separated by the p-type high impurity concentration region 7 from the p-type silicon substrate 1. An entire top face of the n-type photoelectric converter region 8 is in contact directly with the insulating layer 4. The inside side face of the n-type photoelectric converter region 8 is in contact with the p-type silicon substrate 1. Namely, the p-type high impurity concentration region 7 underlies the entire bottom face of the n-type photoelectric converter region 8 and further extends along the entire side faces except for the inside side face of the n-type photoelectric converter region 8. An inside edge of the p-type high impurity concentration region 7 is positioned more inside of the inside edge of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces except for the inside side face of the region 8. The p-type high impurity concentration region 7 as the potential barrier also prevents leakage of charges from the n-type photoelectric converter region 8 to the p-type silicon substrate through the bottom face and the side faces except for the inside side face of the region 8. The p-type high impurity concentration region 7 as the potential barrier reduces smear and noise of images. The extending portion of the p-type high impurity concentration region 7 from the bottom inside edge of the n-type photoelectric converter region 8 in the inside direction toward the drain region 9 increases the effect of reducing smear and noise on image. The solid-state image sensor of this embodiment shows a higher effect of reducing the smear and noise of images than that of the seventh embodiment.

Ninth Embodiment

Figure 11:
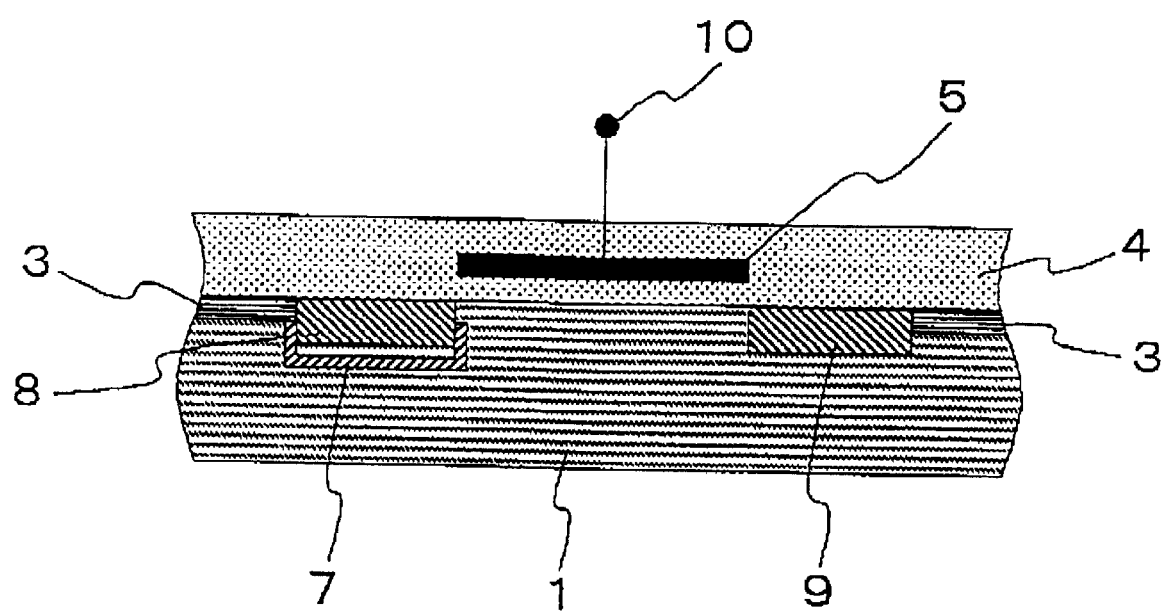
FIG. 11 is a fragmentary cross sectional elevation view of a solid-state image sensor in a ninth embodiment in accordance with the present invention.

A ninth embodiment according to the present invention will be described in detail with reference to the drawings. FIG. 11 is a fragmentary cross sectional elevation view of a solid-state image sensor in a ninth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric convener region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 up to the same level as the bottom of the isolation layer 3, so that the p-type high impurity concentration region 7 is adjacent to but not contact with the entire bottom face and is in contact directly with the side faces of the region 8 up to the same level as the bottom of the isolation layer 3. Both the entire bottom face and the side faces of the n-type photoelectric converter region 8, except above the bottom level of the isolation layer 3, are surrounded by the p-type high impurity concentration region 7. The entire bottom face and the side faces of the n-type photoelectric converter region 8, except above the bottom level of the isolation layer 3, are thus separated by the p-type high impurity concentration region 7 from the p-type silicon substrate 1. An entire top face of the n-type photoelectric converter region 8 is in contact directly with the insulating layer 4. Namely, the p-type high impurity concentration region 7 underlies the entire bottom face of the n-type photoelectric converter region 8 and further extends along the side faces of the n-type photoelectric converter region 8, except above the bottom level of the isolation layer 3.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces of the region 8, except above the bottom level of the isolation layer 3. The p-type high impurity concentration region 7 as the potential barrier also prevents leakage of charges from the n-type photoelectric converter region 8 to the p-type silicon substrate through the bottom face and the side faces of the region 8, except above the bottom level of the isolation layer 3. The p-type high impurity concentration region 7 as the potential barrier reduces smear and noise of images. The solid-state image sensor of this embodiment shows a higher effect of reducing the smear and noise of images than that of the eighth embodiment.

Tenth Embodiment

Figure 12:
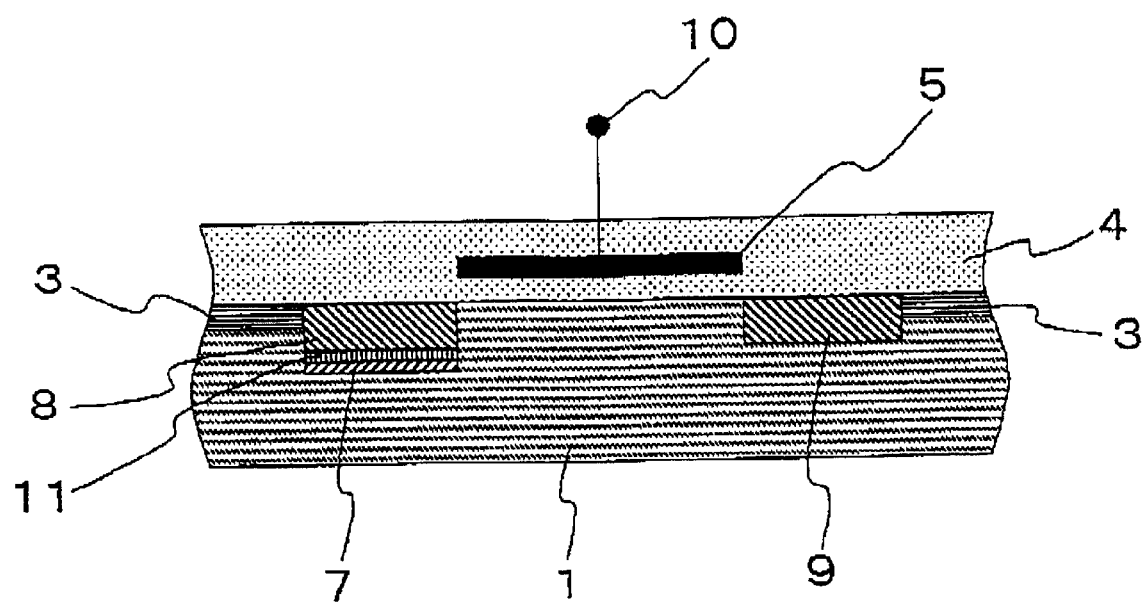
FIG. 12 is a fragmentary cross sectional elevation view of a solid-state image sensor in a tenth embodiment in accordance with the present invention.

A tenth embodiment according to the present invention will be described in detail with reference to the drawings. FIG. 12 is a fragmentary cross sectional elevation view of a solid-state image sensor in a tenth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8, so that an entire bottom face of the n-type photoelectric converter region 8 is adjacent to but not contact with the p-type high impurity concentration region 7.

A p-type interposed diffusion region 11 is further provided between the bottom face of the n-type photoelectric converter region 8 and the p-type high impurity concentration region 7. Namely, the p-type interposed diffusion region 11 underlies the bottom face of the n-type photoelectric converter region 8 and overlies the p-type high impurity concentration region 7. The p-type interposed diffusion region 11 has a different impurity concentration from the p-type silicon substrate 1 and the p-type high impurity concentration region 7. The entire bottom face of the n-type photoelectric converter region 8 is thus separated from the p-type silicon substrate 1 by the p-type interposed diffusion region 11 and the p-type high impurity concentration region 7.

An entire top face of the n-type photoelectric converter region 8 is in contact directly with the insulating layer 4. Side faces of the n-type photoelectric converter region 8 are surrounded partially by the isolation region 3 and mostly by the p-type silicon substrate 1. Namely, the p-type high impurity concentration region 7 underlies the entire bottom face of the p-type interposed diffusion region 11 but does not extend to the side faces of the n-type photoelectric converter region 8. Peripheral edges of the p-type high impurity concentration region 7 are aligned to peripheral edges of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric convener region 8 through the bottom face of the region 8. The p-type high impurity concentration region 7 as the potential barrier also prevents leakage of charges from the n-type photoelectric converter region 8 to the p-type silicon substrate through the bottom face of the region 8. The p-type high impurity concentration region 7 as the potential barrier reduces smear and noise of images.

Eleventh Embodiment

Figure 13:
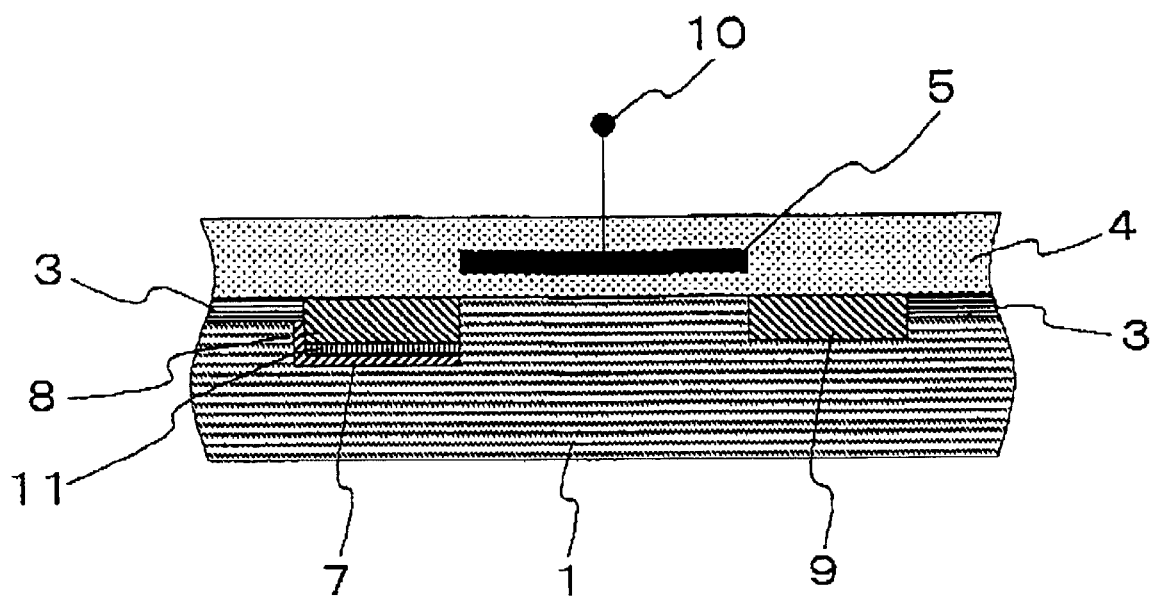
FIG. 13 is a fragmentary cross sectional elevation view of a solid-state image sensor in an eleventh embodiment in accordance with the present invention.

An eleventh embodiment according to the present invention will be described in detail with reference to the drawings. FIG. 13 is a fragmentary cross sectional elevation view of a solid-state image sensor in an eleventh embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 to the bottom of the isolation layer 3, so that the p-type high impurity concentration region 7 is adjacent to but not contact with the entire bottom face and is in contact directly with the side faces except for an inside side face which faces toward the n-type drain region 9.

A p-type interposed diffusion region 11 is further provided between the bottom face of the n-type photoelectric converter region 8 and the p-type high impurity concentration region 7. Namely, the p-type interposed diffusion region 11 underlies the bottom face of the n-type photoelectric converter region 8 and overlies the p-type high impurity concentration region 7. The p-type interposed diffusion region 11 has a different impurity concentration from the p-type silicon substrate 1 and the p-type high impurity concentration region 7. The entire bottom face of the n-type photoelectric converter region 8 is thus separated from the p-type silicon substrate 1 by the p-type interposed diffusion region 11 and the p-type high impurity concentration region 7. Both the entire bottom face and the side faces except for the inside side face of the n-type photoelectric converter region 8 are surrounded by the p-type high impurity concentration region 7. The entire bottom face and the side faces except for the inside side face of the n-type photoelectric converter region 8 are thus separated by the p-type high impurity concentration region 7 and the p-type interposed diffusion region 11 from the p-type silicon substrate 1.

An entire top face of the n-type photoelectric converter region 8 is in contact directly with the insulating layer 4. The inside side face of the n-type photoelectric converter region 8 is in contact with the p-type silicon substrate 1. Namely, the p-type high impurity concentration region 7 underlies the entire bottom face of the n-type photoelectric converter region 8 and further extends along the entire side faces except for the inside side face of the n-type photoelectric converter region 8. An inside edge of the p-type high impurity concentration region 7 is aligned to the inside edge of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces except for the inside side face of the region 8. The p-type high impurity concentration region 7 as the potential barrier also prevents leakage of charges from the n-type photoelectric converter region 8 to the p-type silicon substrate through the bottom face and the side faces except for the inside side face of the region 8. The p-type high impurity concentration region 7 as the potential barrier reduces smear and noise of images. The solid-state image sensor of this embodiment shows a higher effect of reducing the smear and noise of images than that of the tenth embodiment.

Twelfth Embodiment

Figure 14:
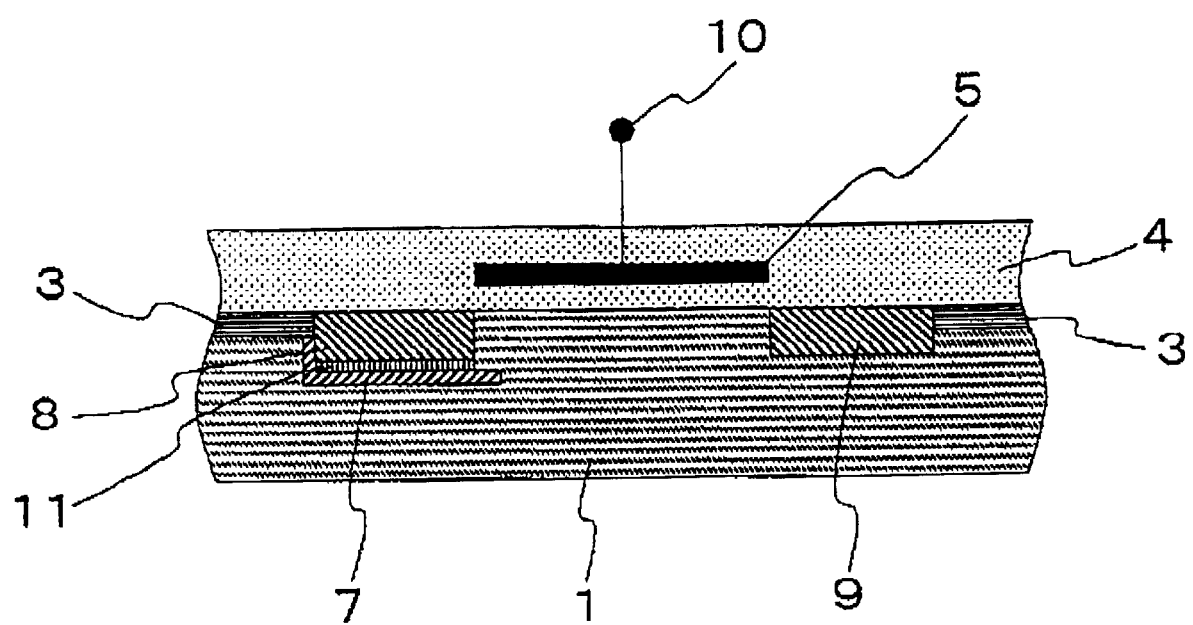
FIG. 14 is a fragmentary cross sectional elevation view of a solid-state image sensor in a twelfth embodiment in accordance with the present invention.

A twelfth embodiment according to the present invention will be described in detail with reference to the drawings. FIG. 14 is a fragmentary cross sectional elevation view of a solid-state image sensor in a twelfth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 to the bottom of the isolation layer 3 and further extends from the bottom inside edge of the n-type photoelectric converter region 8 in the inside direction toward the drain region 9, so that the p-type high impurity concentration region 7 is adjacent to but not contact with the entire bottom face and is in contact directly with the side faces except for an inside side face which faces toward the n-type drain region 9.

A p-type interposed diffusion region 11 is further provided between the bottom face of the n-type photoelectric converter region 8 and the p-type high impurity concentration region 7. Namely, the p-type interposed diffusion region 11 underlies the bottom face of the n-type photoelectric converter region 8 and overlies the p-type high impurity concentration region 7. The p-type interposed diffusion region 11 has a different impurity concentration from the p-type silicon substrate 1 and the p-type high impurity concentration region 7. The entire bottom face of the n-type photoelectric converter region 8 is thus separated from the p-type silicon substrate 1 by the p-type interposed diffusion region 11 and the p-type high impurity concentration region 7. Both the entire bottom face and the side faces except for the inside side face of the n-type photoelectric converter region 8 are surrounded by the p-type high impurity concentration region 7. The entire bottom face and the side faces except for the inside side face of the n-type photoelectric converter region 8 are thus separated by the p-type high impurity concentration region 7 and the p-type interposed diffusion region 11 from the p-type silicon substrate 1.

An entire top face of the n-type photoelectric converter region 8 is in contact directly with the insulating layer 4. The inside side face of the n-type photoelectric converter region 8 is in contact with the p-type silicon substrate 1. Namely, the p-type high impurity concentration region 7 underlies the entire bottom face of the n-type photoelectric converter region 8 and further extends along the entire side faces except for the inside side face of the n-type photoelectric converter region 8. An inside edge of the p-type high impurity concentration region 7 is positioned more inside of the inside edge of the n-type photoelectric converter region 8.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces except for the inside side face of the region 8.

The p-type high impurity concentration region 7 as the potential barrier also prevents leakage of charges from the n-type photoelectric converter region 8 to the p-type silicon substrate through the bottom face and the side faces except for the inside side face of the region 8. The p-type high impurity concentration region 7 as the potential barrier reduces smear and noise of images. The extending portion of the p-type high impurity concentration region 7 from the bottom inside edge of the n-type photoelectric converter region 8 in the inside direction toward the drain region 9 increases the effect of reducing smear and noise on image. The solid-state image sensor of this embodiment shows a higher effect of reducing the smear and noise of images than that of the eleventh embodiment.

Thirteenth Embodiment

Figure 15:
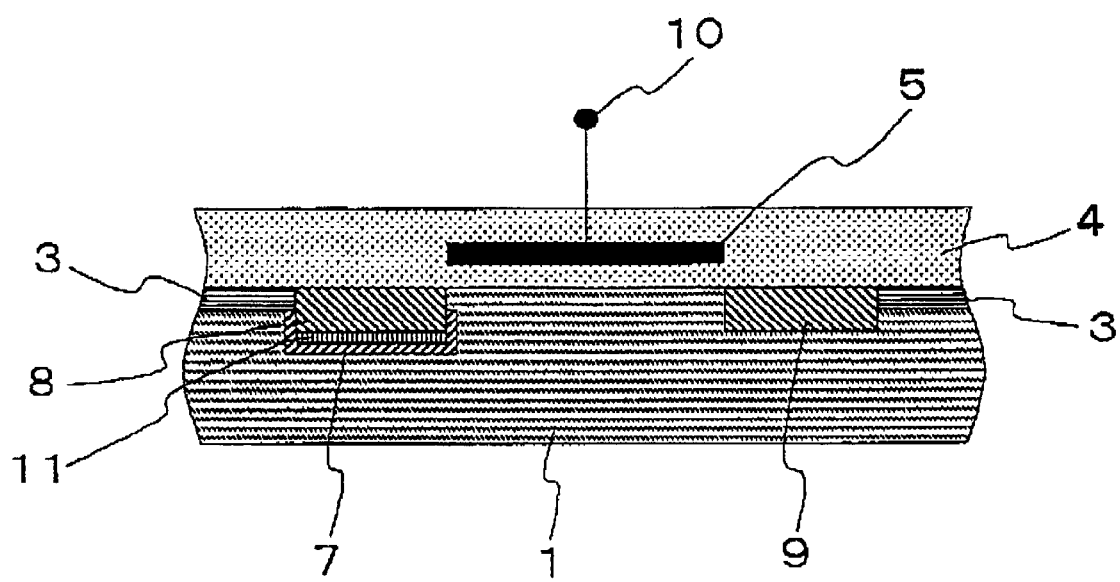
FIG. 15 is a fragmentary cross sectional elevation view of a solid-state image sensor in a thirteenth embodiment in accordance with the present invention.

A thirteenth embodiment according to the present invention will be described in detail with reference to the drawings. FIG. 15 is a fragmentary cross sectional elevation view of a solid-state image sensor in a thirteenth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 up to the same level as the bottom of the isolation layer 3, so that the p-type high impurity concentration region 7 is adjacent to but not contact with the entire bottom face and is in contact directly with the side faces of the region 8 up to the same level as the bottom of the isolation layer 3.

A p-type interposed diffusion region 11 is further provided between the bottom face of the n-type photoelectric converter region 8 and the p-type high impurity concentration region 7. Namely, the p-type interposed diffusion region 11 underlies the bottom face of the n-type photoelectric converter region 8 and overlies the p-type high impurity concentration region 7. The p-type interposed diffusion region 11 has a different impurity concentration from the p-type silicon substrate 1 and the p-type high impurity concentration region 7. The entire bottom face of the n-type photoelectric converter region 8 is thus separated from the p-type silicon substrate 1 by the p-type interposed diffusion region 11 and the p-type high impurity concentration region 7. Both the entire bottom face and the side faces of the n-type photoelectric converter region 8, except above the bottom level of the isolation layer 3, are surrounded by the p-type high impurity concentration region 7. The entire bottom face and the side faces of the n-type photoelectric converter region 8, except above the bottom level of the isolation layer 3, are thus separated by the p-type high impurity concentration region 7 and the p-type interposed diffusion region 11 from the p-type silicon substrate 1.

An entire top face of the n-type photoelectric converter region 8 is in contact directly with the insulating layer 4. Namely, the p-type high impurity concentration region 7 underlies the entire bottom face of the n-type photoelectric converter region 8 and further extends along the side faces of the n-type photoelectric converter region 8, except above the bottom level of the isolation layer 3.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces of the region 8, except above the bottom level of the isolation layer 3. The p-type high impurity concentration region 7 as the potential barrier also prevents leakage of charges from the n-type photoelectric converter region 8 to the p-type silicon substrate through the bottom face and the side faces of the region 8, except above the bottom level of the isolation layer 3. The p-type high impurity concentration region 7 as the potential barrier reduces smear and noise of images. The solid-state image sensor of this embodiment shows a higher effect of reducing the smear and noise of images than that of the twelfth embodiment.

Fourteenth Embodiment

Figure 16:
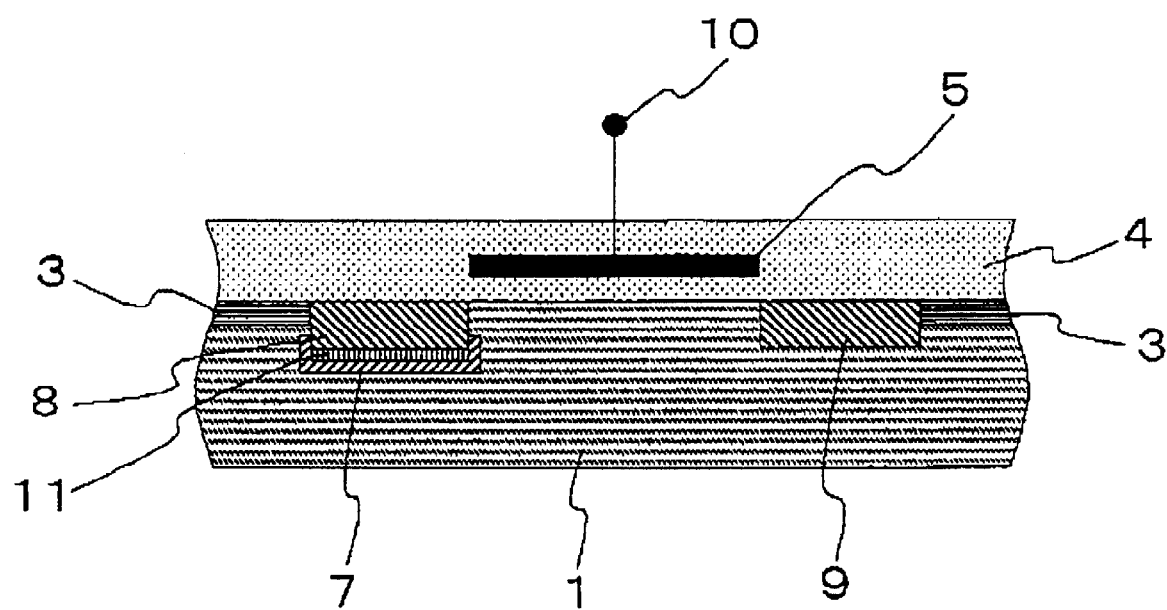
FIG. 16 is a fragmentary cross sectional elevation view of a solid-state image sensor in a fourteenth embodiment in accordance with the present invention.

A fourteenth embodiment according to the present invention will be described in detail with reference to the drawings. FIG. 16 is a fragmentary cross sectional elevation view of a solid-state image sensor in a fourteenth embodiment in accordance with the present invention. The solid-state image sensor has a p-type silicon substrate 1. Isolation regions 3 of silicon dioxide are selectively provided in an upper region of the p-type silicon substrate 1, so that the isolation regions 3 define a device region.

An n-type photoelectric converter region 8 is selectively provided in the device region of the p-type silicon substrate 1. The n-type photoelectric converter region 8 converts incident photons into electric signals. An n-type drain region 9 is also selectively provided in the device region of the p-type silicon substrate 1, wherein the drain region 9 is separated from the n-type photoelectric converter region 8 by a channel region. An insulating layer 4 is provided which overlies an upper face of the silicon substrate 1. A transfer gate electrode 5 is provided in the insulating layer 4, so that the transfer gate electrode 5 overlies the channel region between the drain region 9 and the n-type photoelectric converter region 8. A connection line 10 is connected to the transfer gate electrode 5.

A p-type high impurity concentration region 7 is selectively provided, which underlies the n-type photoelectric converter region 8 and also extends along side faces of the region 8 up to the lower level than the bottom of the isolation layer 3, so that the p-type high impurity concentration region 7 is adjacent to but not contact with the entire bottom face and is in contact directly with the side faces of the region 8 up to the lower level than the bottom of the isolation layer 3.

A p-type interposed diffusion region 11 is further provided between the bottom face of the n-type photoelectric converter region 8 and the p-type high impurity concentration region 7. Namely, the p-type interposed diffusion region 11 underlies the bottom face of the n-type photoelectric converter region 8 and overlies the p-type high impurity concentration region 7. The p-type interposed diffusion region 11 has a different impurity concentration from the p-type silicon substrate 1 and the p-type high impurity concentration region 7. The entire bottom face of the n-type photoelectric converter region 8 is thus separated from the p-type silicon substrate 1 by the p-type interposed diffusion region 11 and the p-type high impurity concentration region 7. Both the entire bottom face and the side faces of the n-type photoelectric converter region 8, except above the lower level than the bottom level of the isolation layer 3, are surrounded by the p-type high impurity concentration region 7. The entire bottom face and the side faces of the n-type photoelectric converter region 8, except above the lower level than the bottom level of the isolation layer 3, are thus separated by the p-type high impurity concentration region 7 and the p-type interposed diffusion region 11 from the p-type silicon substrate 1.

An entire top face of the n-type photoelectric converter region 8 is in contact directly with the insulating layer 4. Namely, the p-type high impurity concentration region 7 underlies the entire bottom face of the n-type photoelectric converter region 8 and further extends along the side faces of the n-type photoelectric converter region 8, except above the lower level than the bottom level of the isolation layer 3.

The p-type high impurity concentration region 7 has a deeper level than a bottom level of the n-type drain region 9. The p-type high impurity concentration region 7 has the same conductivity type as the p-type silicon substrate 1. The p-type high impurity concentration region 7 has a higher impurity concentration than the p-type silicon substrate 1. The p-type high impurity concentration region 7 serves as a potential barrier to charges. The p-type high impurity concentration region 7 as the potential barrier prevents charges generated in the p-type silicon substrate 1 from being drawn into the n-type photoelectric converter region 8 through the bottom face and the side faces of the region 8, except above the bottom level of the isolation layer 3. The p-type high impurity concentration region 7 as the potential barrier also prevents leakage of charges from the n-type photoelectric converter region 8 to the p-type silicon substrate through the bottom face and the side faces of the region 8, except above the lower level than the bottom level of the isolation layer 3. The p-type high impurity concentration region 7 as the potential barrier reduces smear and noise of images.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A solid-state image sensor comprising:
   a semiconductor bulk region of a first conductivity type;
   at least a drain region of a second conductivity type selectively provided in said semiconductor bulk region;
   at least a photoelectric converter region of said second conductivity type selectively provided in said semiconductor bulk region, and said photoelectric converter region being separated from said drain region; and
   at least a potential barrier region of said first conductivity type selectively provided in said semiconductor bulk region, said potential barrier region being adjacent to at least a part of bottom and side faces of said photoelectric converter region, and said potential barrier region having a higher impurity concentration than said semiconductor bulk region,
   wherein said potential barrier region is distanced by a part of said bulk region from an entire region of said bottom face of said photoelectric converter region.

2. The sensor as claimed in claim 1, wherein said potential barrier region has peripheral edges which are substantially aligned to peripheral edges of said photoelectric converter region.

3. The sensor as claimed in claim 1, wherein said potential barrier region has an inside-extending portion which extends from an inside edge of said photoelectric converter region toward said drain region, so that an inside edge of said potential barrier region is positioned closer to said drain region than said inside edge of said photoelectric converter region.

4. The sensor as claimed in claim 1, wherein said potential barrier region has a vertically extending portion which extends along said side faces of said photoelectric converter region.

5. A solid-state image sensor comprising:
   a semiconductor bulk region of a first conductivity type;
   at least a drain region of a second conductivity type selectively provided in said semiconductor bulk region;
   at least a photoelectric converter region of said second conductivity type selectively provided in said semiconductor bulk region, and said photoelectric converter region being separated from said drain region;
   at least a potential barrier region of said first conductivity type selectively provided in said semiconductor bulk region, said potential barrier region being adjacent to at least a part of bottom and side faces of said photoelectric converter region, and said potential barrier region having a higher impurity concentration than said semiconductor bulk region; and
   an interposed region of said first conductivity type, which overlies said potential barrier region and underlies a bottom face of said photoelectric converter region, and said interposed region having a different impurity concentration from said semiconductor bulk region and said potential barrier region, so that said potential barrier region is separated by said interposed region from said bottom face of said photoelectric converter region.

6. The sensor as claimed in claim 5, wherein said potential barrier region has peripheral edges which are substantially aligned to peripheral edges of said photoelectric converter region.

7. The sensor as claimed in claim 5, wherein said potential barrier region has an inside-extending portion which extends from an inside edge of said photoelectric converter region toward said drain region, so that an inside edge of said potential barrier region is positioned closer to said drain region than said inside edge of said photoelectric converter region.

8. The sensor as claimed in claim 5, wherein said potential barrier region has a vertically extending portion which extends along said side faces of said photoelectric converter region.

9. A solid-state image sensor comprising:
   semiconductor bulk region of a first conductivity type;
   at least a drain region of a second conductivity type selectively provided in said semiconductor bulk region;
   at least a photoelectric converter region of said second conductivity type selectively provided in said semiconductor bulk region, and said photoelectric converter region being separated from said drain region;
   at least a potential barrier region of said first conductivity type selectively provided in said semiconductor bulk region, said potential barrier region being adjacent to at least a part of bottom and side faces of said photoelectric converter region, and said potential barrier region having a higher impurity concentration than said semiconductor bulk region; and
   an isolation region selectively provided in said semiconductor bulk region, and said isolation region being in contact with an upper region of said side faces of said photo-converter region, except an inside side face which faces toward said drain region.

* * * * *